(12) United States Patent
Poplevine et al.

(10) Patent No.: US 6,642,587 B1
(45) Date of Patent: Nov. 4, 2003

(54) HIGH DENSITY ROM ARCHITECTURE

(75) Inventors: Pavel Poplevine, Foster City, CA (US); Hengyang Lin, San Jose, CA (US); Andrew J. Franklin, Santa Clara, CA (US); Ernes Ho, Sunnyvale, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/214,021

(22) Filed: Aug. 7, 2002

(51) Int. Cl.⁷ ............................................. H01L 29/76
(52) U.S. Cl. .................. 257/390; 257/391; 438/128; 438/129; 438/130; 438/275; 438/278; 438/290
(58) Field of Search ................ 257/390, 391; 438/128, 129, 130, 275, 278, 290, 217, 276, 289

(56) References Cited

U.S. PATENT DOCUMENTS

| | | | |
|---|---|---|---|
| 4,426,686 A | | 1/1984 | Yamamoto et al. .......... 365/104 |
| 5,117,389 A | * | 5/1992 | Yiu ............................. 365/104 |
| 5,329,483 A | * | 7/1994 | Wada et al. ................. 365/182 |
| 5,477,484 A | | 12/1995 | Nakashima ................. 365/182 |
| 5,703,820 A | | 12/1997 | Kohno ......................... 365/204 |
| 5,745,401 A | | 4/1998 | Lee ............................. 365/104 |
| 5,787,033 A | | 7/1998 | Maeno ......................... 365/182 |
| 5,866,457 A | * | 2/1999 | Wen ............................. 438/275 |
| 5,930,180 A | | 7/1999 | Callahan ................ 365/189.09 |
| 6,084,794 A | * | 7/2000 | Lu et al. ..................... 365/104 |
| 6,136,648 A | * | 10/2000 | Oya ........................... 438/257 |
| 6,236,587 B1 | * | 5/2001 | Gudesen et al. ............ 365/105 |
| 6,363,001 B1 | | 3/2002 | Borot et al. ................ 365/104 |
| 2002/0060347 A1 | * | 5/2002 | Martin et al. ................ 257/390 |

* cited by examiner

*Primary Examiner*—Hoai Ho
*Assistant Examiner*—Andy Huynh
(74) *Attorney, Agent, or Firm*—Stallman & Pollock LLP

(57) ABSTRACT

A ROM array which provides for reduced size and power consumption. The bit cell of the ROM provides that a first type of information is stored in the bit cell when a transistor is disposed between a bit line and a word line, and a second type of information is stored in the cell when no transistor is disposed between the bit line and the word line. In the bit cell a contact between a bit line and a region where a transistor drain can be formed in a substrate is provided in those instances when a transistor is formed between the bit line and a word line. In those instances when a bit cell provides no transistors between the word line and the bit line, no contact is provided between the bit line and the region where a transistor drain can be formed. Further, where a bit cell does not provide a transistor between the bit line and the word line a bit cell region in the substrate can consist substantially of an isolating dielectric material.

15 Claims, 11 Drawing Sheets

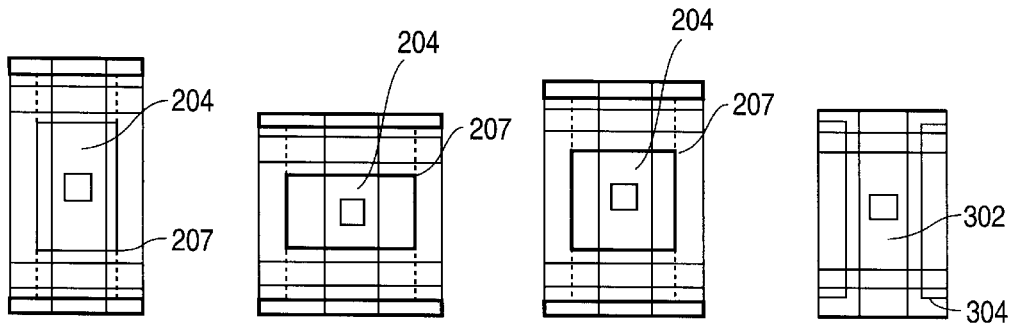
FIG. 3a
(PRIOR ART)
FIG. 3b
(PRIOR ART)
FIG. 3c
(PRIOR ART)
FIG. 3d
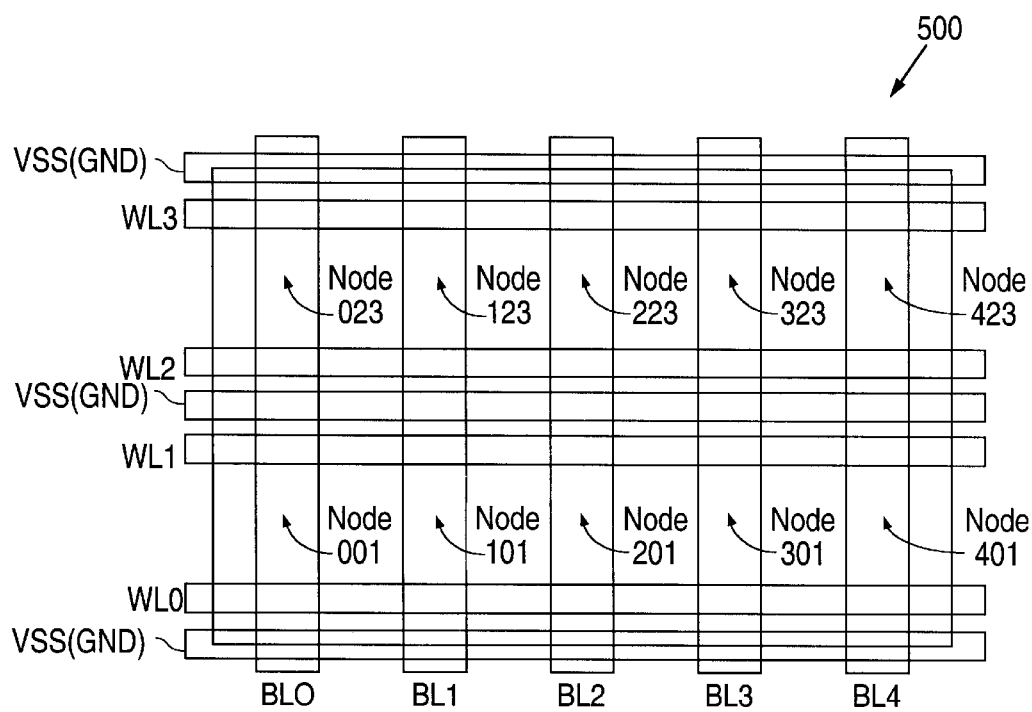
FIG. 4a

HIGH DENSITY ROM ARCHITECTURE

TECHNICAL FIELD

The present invention relates to the field of read only memory (ROM) cells, and ROM memory architecture providing for a high density and low power consumption.

BACKGROUND OF THE INVENTION

The present invention is directed to a ROM memory device. A ROM is a read only memory device which programmed during an integrated circuit manufacturing process. Once the ROM has been programmed the data in the ROM is fixed such that the data stored in the ROM can be read, but it cannot be changed. FIG. 1 shows a ROM memory array architecture 100 of the prior art. This architecture includes an array 100 of bit cells, where each bit cell corresponds to an area between a bit line (BL0–BL4) and a word line (WL0–WL3). The ROM array 100 is programed with a combination of ones (1) and zeros (0). A zero (0) is stored in a bit cell of the ROM array 100 by providing an NMOS transistor between a bit line and a word line. For example, by virtue of the fact that a transistor T10 is formed between the bit line BL0 and word line WL1 a 0 is stored in the corresponding bit cell. The word line acts as a gate for NMOS transistor T10 and is electrically coupled to the channel region of the transistor through a dielectric layer such as silicon oxide. The drain of the NMOS transistor T10 is coupled to the bit line BL0.

To sense whether a bit cell contains either a 0 or 1, a voltage is applied to the word line and if a transistor is coupled between the bit line and the word line at the bit cell being read, then current flows from the bit line through the transistor to ground. The detection of current through the NMOS transistor is achieved using a sense amplifier coupled to the bit line. Typically the presence of a transistor coupled between the word line and the bit line, which results in current flow being sensed on the bit line when a voltage is applied to the word line, corresponds to a 0 being stored in the bit cell.

A prior art diffusion ROM array 200 layout is shown in FIG. 2a. The prior art diffusion array 200 shows an array which has not been programmed—or it could be viewed as a diffusion array where all of the bit cells are programmed such that there are no transistors coupling any of the bit lines to any of the word lines, and hence all of the bit cells are programmed such that they store a data bit of 1. The operation of these ROMs is more clearly illustrated in connection with FIG. 2b below.

The layout shown in FIG. 2b shows a prior art diffusion ROM 201 where N+ diffusion has been used to program the ROM such that it corresponds to the architecture shown in FIG. 1. The word lines (WL0–WL3) are typically formed of polysilicon. The contacts 202 which are present for each bit cell (see, Node 001 thru Node 423 where each node corresponds to two bit cells) are also typically formed of using a metal interconnect to the N+ node diffusion area. Each node has a first region 204, which is a node diffusion region that is used to form a drain region. It should be noted that, as shown in FIG. 2a, the node diffusion region 204 is present at each node regardless of whether a transistor has been formed to couple the bit line to a word line.

Each of the bit cells is coupled to one of the bit lines (BL1–BL4) by a contact 202. Again it should be noted that, as shown in FIG. 2a, the contact 202 coupling the bit line to a node diffusion region is present at each node regardless of whether a transistor has been formed to couple the bit line to a word line. The bit lines are typically formed of metal. The VSS (Gnd) lines are typically formed using N+ diffusion into the P type substrate 203.

In the prior art diffusion ROM 201 (FIG. 2b) an NMOS transistor can be formed at any of the nodes of the ROM by extending the N+ diffusion from the node diffusion area 204 through the contact 202 connected to the bit line. Specifically, as shown in FIG. 2b the dotted lines 205 show regions where N+ diffusion into the underlying substrate forms NMOS transistors. The N+ diffusion extends the node diffusion region 204 to form a drain which is adjacent to the word line and further a source 206 is formed in the substrate by diffusing N+ into the substrate in the area between the word line and the Vss (gnd) area where N+ diffusion is also present. The word line acts as a gate, which is electrically coupled through a dielectric, with a channel region of the NMOS transistor.

FIG. 2b shows transistors formed between bit line BL1 and word line WL1, and bit line BL0 and word line WL2 for example. It should be noted that the contact 202 and node diffusion area 204 can be used to create the NMOS transistors to adjacent word lines. For example, at node 401, bit line (BL4), and the diffusion region is used to create bit line NMOS transistors to WL0 and to WL1.

FIG. 2c shows a cross section of FIG. 2b taken along Line A—A at the bit line BL0. It should be noted that FIG. 2c is not to scale and is provided for generally illustrating the lay out of different elements of the ROM. In this case, the substrate 203 is a P type silicon substrate. Node 001 is shown having a node diffusion area 204 with N+ diffusion. This region 204 is present at each of the cells whether a transistor is coupled between the corresponding bit line and a word line. Areas 210 are shown adjacent to the node diffusion region 204 of node 001, and adjacent to the node diffusion region 204 of node 023. The regions 210 are areas of N+ diffusion; thus areas 210 in combination with areas 204 form a drain region for an NMOS transistor. Regions 212 are also areas with N+ diffusion. These regions 212 form sources for the NMOS transistors and these sources are coupled to Vss (gnd). The regions 213 form channels between the regions 210 and 212. The channel region can conduct electrical current when a voltage is applied to the adjacent word line, and is not conductive when no voltage is present on the word line. The cross sectional view of FIG. 2c shows transistors T10 (coupling BL0 to WL1) and T20 (coupling BL0 to WL2) as shown in FIG. 1. The word lines WL1 and WL2 act as gates for the transistors, and are electrically coupled, via an intervening gate oxide dielectric material 215 with the channel regions 213, such that when a voltage is applied to the word line the channel regions 213 become conductive, as discussed above.

FIG. 2d shows a cross section of FIG. 2b taken along Line B—B, i.e. along bit line BL3. As shown in FIG. 1, and FIGS. 2b and 2d no NMOS transistors are formed between the bit line BL3 and any of the word lines WL0–WL3. Although no NMOS transistors are formed along bit line BL3, each bit line still has a node diffusion region 204 with N type diffusion and a contact 202. Thus, the bit cell region 215 in the substrate 203 includes both the N type conductivity area of the node diffusion area 204 and the dielectric isolation region 209.

As shown above, the prior art ROM bit cells require the presence of the node diffusion area 204 and a contact 202, so that the ROM array can be programmed to achieve the desired connectivity which occurs when the diffusion node is extended during the programming of the ROM. For more advanced processes the node diffusion region 204, which is sometimes referred to as an "island", has a minimum area requirement specified by process design rules that are intended to ensure a high yield. This minimum area process rules will limit the minimum size of a ROM bit cell and limits the minimum area of the complete array of bit cells of the ROM. An example of this is shown in FIG. 2*e* and FIGS. 3*a–c*. Specifically, it can be seen that a minimum node diffusion area 207 has a significant effect on the overall size of the bit cells and the overall sized of the ROM. FIGS. 3*a–c* illustrate that the minimum node diffusion area 207 can take on various aspect ratios regarding the length and width of the node diffusion area.

SUMMARY

The present invention is directed to a ROM which allows for a reduced size by forming the ROM such that a contact and a node diffusion region are not present at those nodes where a transistor is not coupling a bit line to a word line. In one embodiment, a ROM for storing information, includes a substrate having a plurality of bit cell regions formed in substrate. Proximate to the substrate are a plurality of columns of bit lines and a plurality of rows of word lines. The bit lines and word lines form intersection areas which are nodes that correspond to the plurality of bit cell regions. The embodiment includes a first transistor formed in a first bit cell region, which corresponds a first node, wherein a first bit line at the first node is coupled to the first transistor by a first contact. At a second node a second bit line is separated from a second bit cell region by an insulating layer.

In another embodiment a ROM for storing information, includes a substrate having a plurality of bit cell regions formed in substrate. A plurality of columns of bit lines are disposed proximate to the substrate, and a plurality of rows of word lines are disposed proximate to the substrate. The bit lines and word lines have intersection areas which form nodes that correspond to the plurality of bit cell regions formed in the substrate. A first bit cell region, which corresponds to a first node, has a first transistor, and a first bit line at the first node is coupled to the first transistor by a contact. The embodiment further includes a second bit cell region which corresponds to a second node, wherein the second bit cell region consists substantially of an isolating dielectric material.

In another embodiment a ROM includes an array of bit cells. The array includes a first bit cell which stores a first type of information, and the bit cell includes a first bit cell region disposed in a substrate. The first bit cell region includes a first region which has a first conductivity type such that it forms a drain, and includes a second region of a second conductivity type which is adjacent to the first region and forms a channel, and includes a third region which has the first conductivity type and forms a source. The array also includes a second bit cell which stores a second type of information, and includes a second bit cell region disposed in a substrate. The second bit cell region consists of a dielectric isolation region.

The features and advantages of the present invention will be more fully appreciated upon consideration of the following detailed description of the invention and the accompanying drawings, which set forth an illustrative embodiment in which the principles of the invention are utilized.

BRIEF DESCRIPTION OF THE DRAWINGS

FIGS. 3*a–d* are views of aspects of a bit cell of a ROM.

FIGS. 4*a–d* are views of a ROM array lay out of the present invention.

DETAILED DESCRIPTION

Figure 2A:
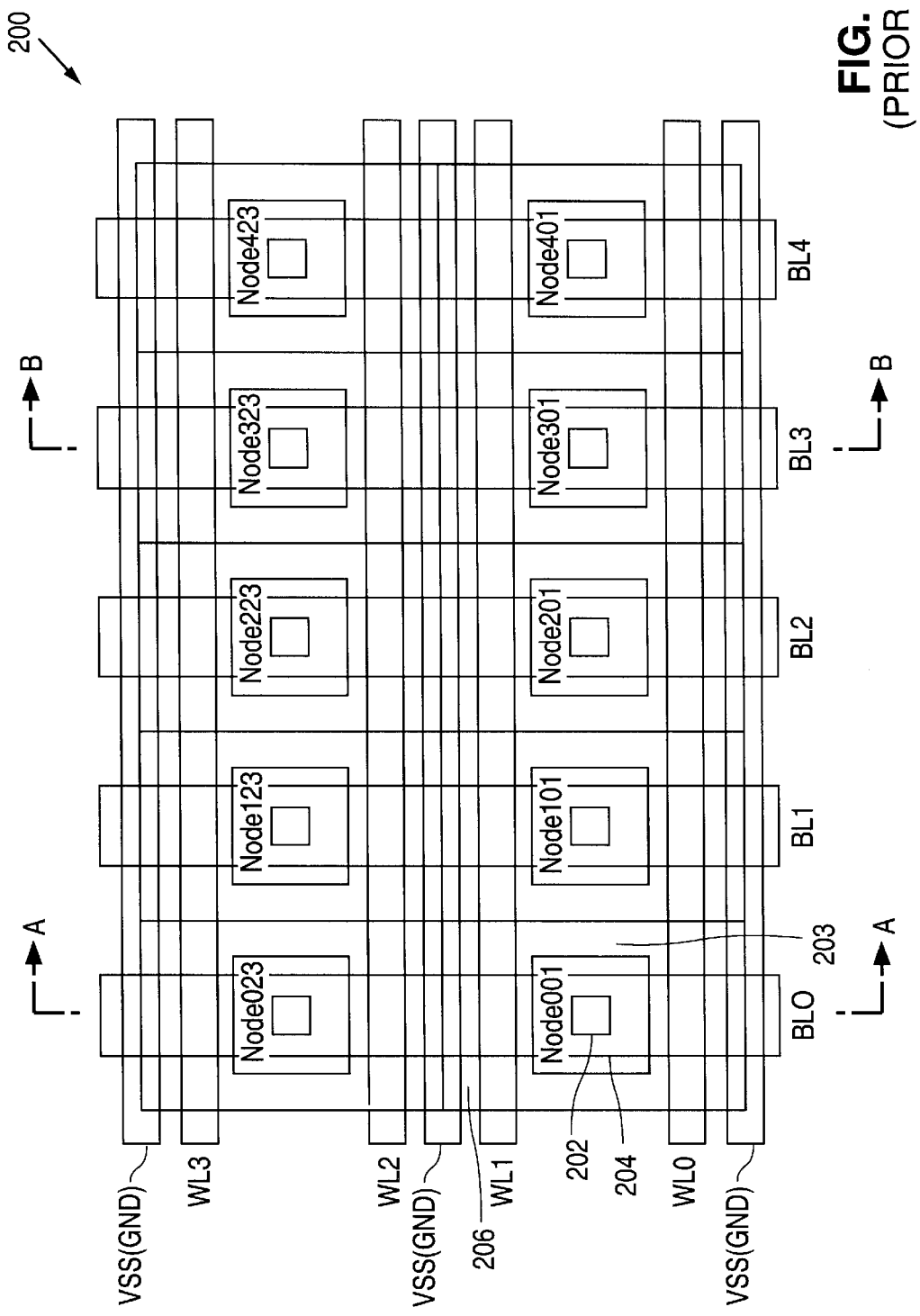
FIGS. 2*a–e* are views of a ROM array layout of the prior art.

The approach herein for achieving a smaller bit cells arises from the recognition that a contact 202 and a node diffusion region 204 (see ROM 201 (FIG. 2*a*)) need not be created for those nodes where a transistor is not connected between a bit line and a word line. Additional developments related to smaller bit cells and reduced power consumption in a ROM by utilizing inversion programming, are discussed in detail in commonly assigned co-pending patent application entitled HIGH DENSITY ROM ARCHITECTURE WITH INVERSION PROGRAMMING, application Ser. No. 10/213,845, and filed on Aug. 7, 2002.

Aspects of the approach used herein can be understood by considering a substrate, word lines, bit lines and ground diffusion regions as shown in FIG. 4*a*. FIG. 4*a* shows a view of an unprogrammed ROM array 500 of the present invention—or it could be considered as a ROM where all the bit cells are programmed with a one (1) (i.e. there are no transistors connecting bit lines to word lines). In contrast with an unprogrammed ROM array of the prior art (see e.g. FIG. 2*a*) the nodes (Node 001–Node 423) of the unprogrammed array 500 do not have node diffusion areas 204 as are present in the prior art, nor does it have contacts 202.

Figure 1:
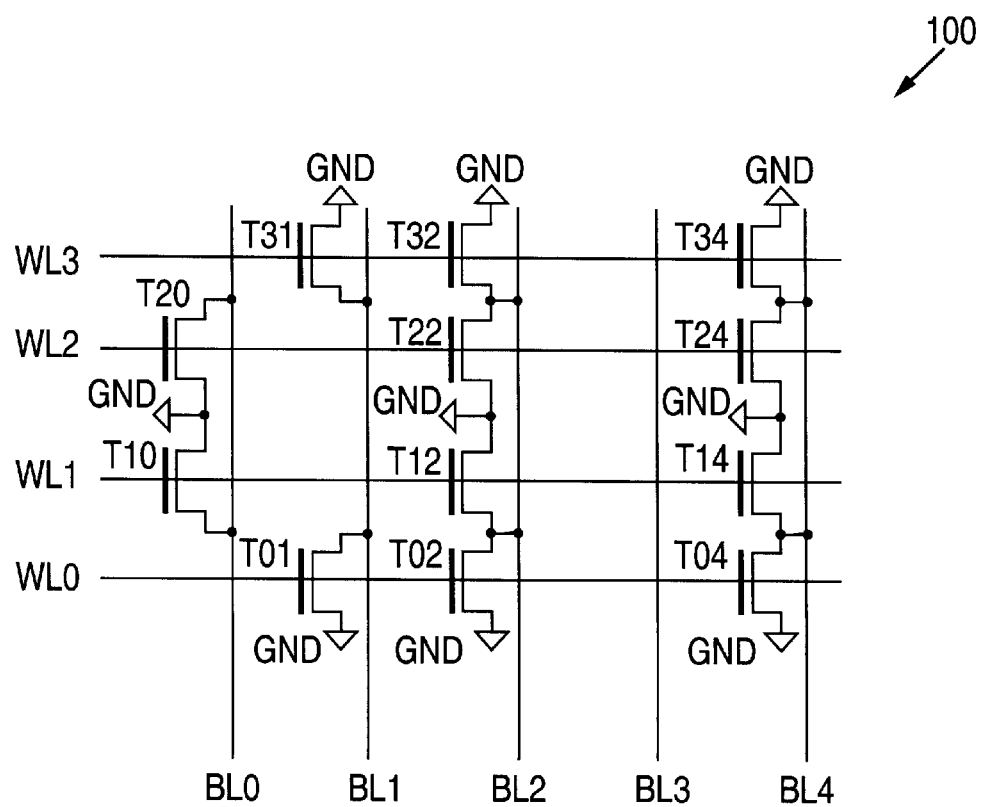
FIG. 1 is a view of a ROM array of the prior art.
Figure 4B:
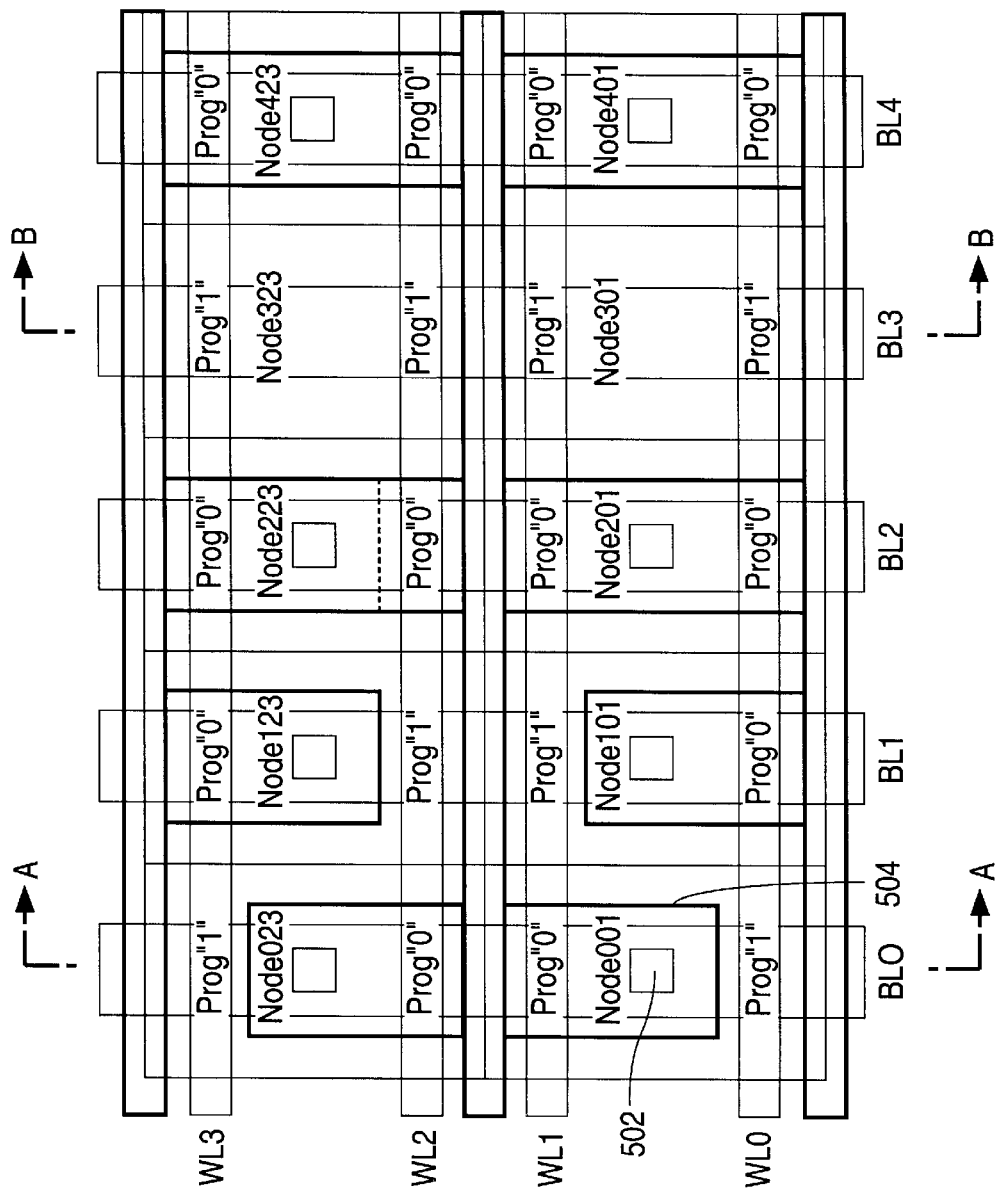

To program the ROM array, a memory compiler is provided which adds diffusion regions (node diffusion regions) and contacts only for those nodes which have a transistor between the bit line and a corresponding word line. With cells of the present invention a node does not have a minimum area rule for a node diffusion region when there is no transistor coupled to a bit line. FIG. 4*b* shows a ROM array which is programmed such that it stores the same information as shown in FIG. 1. As shown in FIG. 4*b*, contacts 502 are created for nodes where a transistor is created between the bit line and a corresponding word line, but there are no contacts where a transistor is not present between a corresponding word line and bit line. For example, no contacts are formed for bit line BL3 (nodes 301 and 323).

Figure 2B:
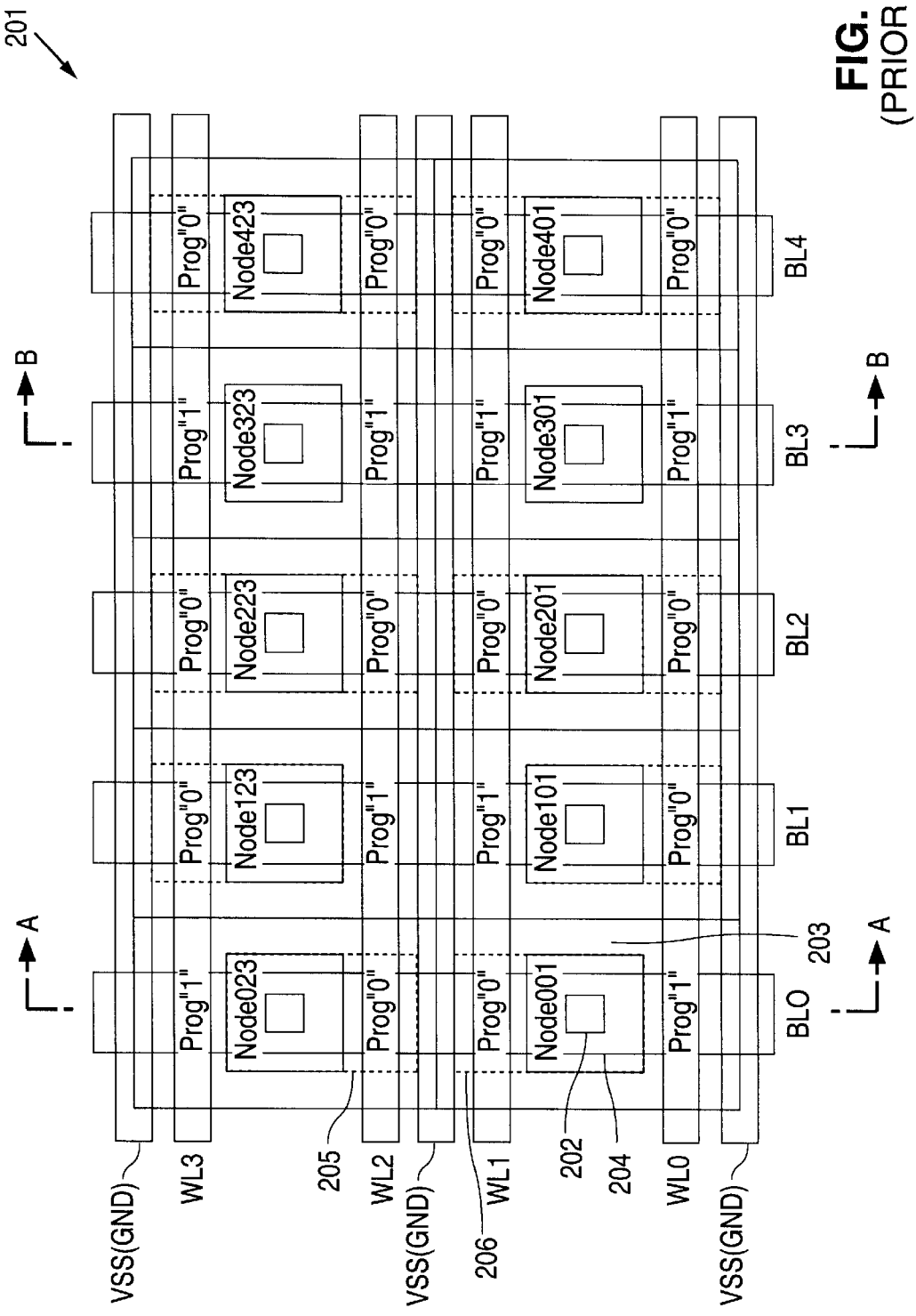
Figure 2C:
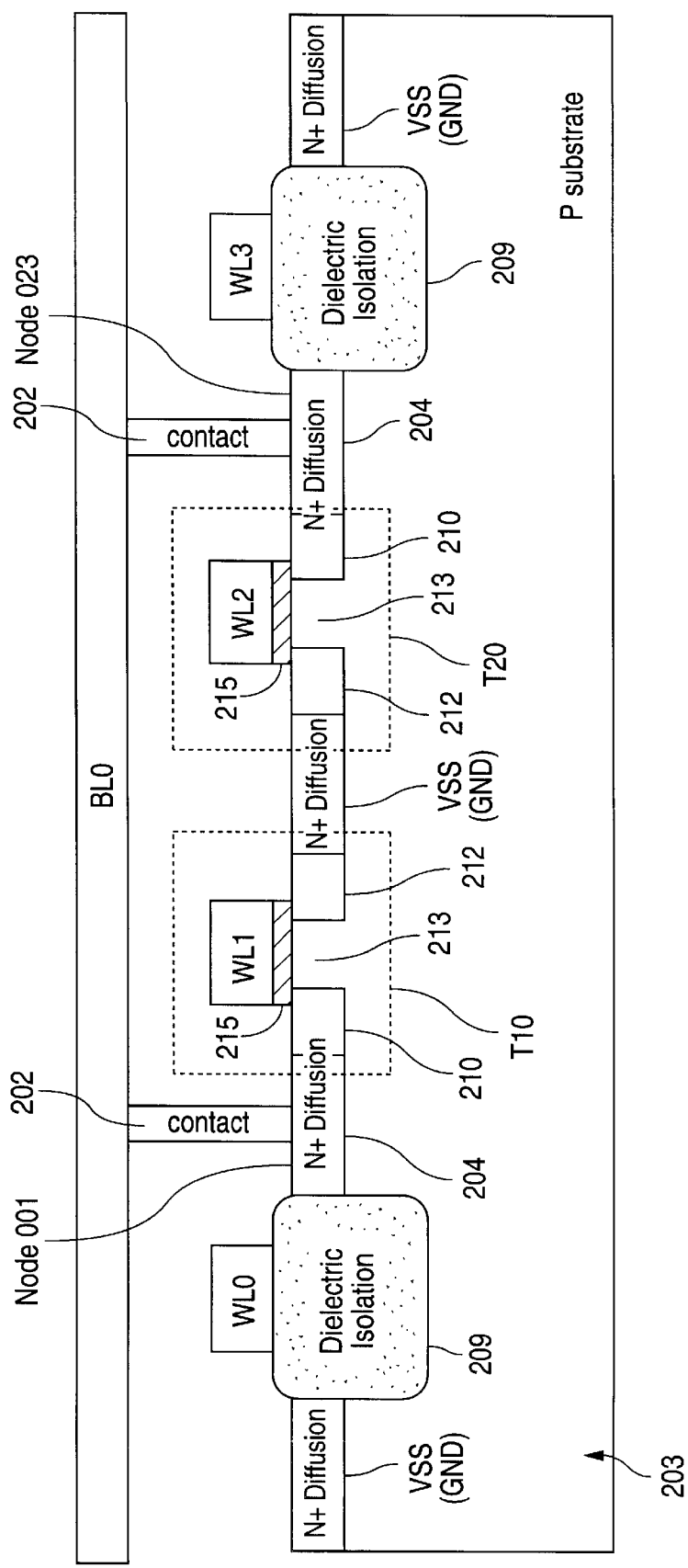
Figure 2D:
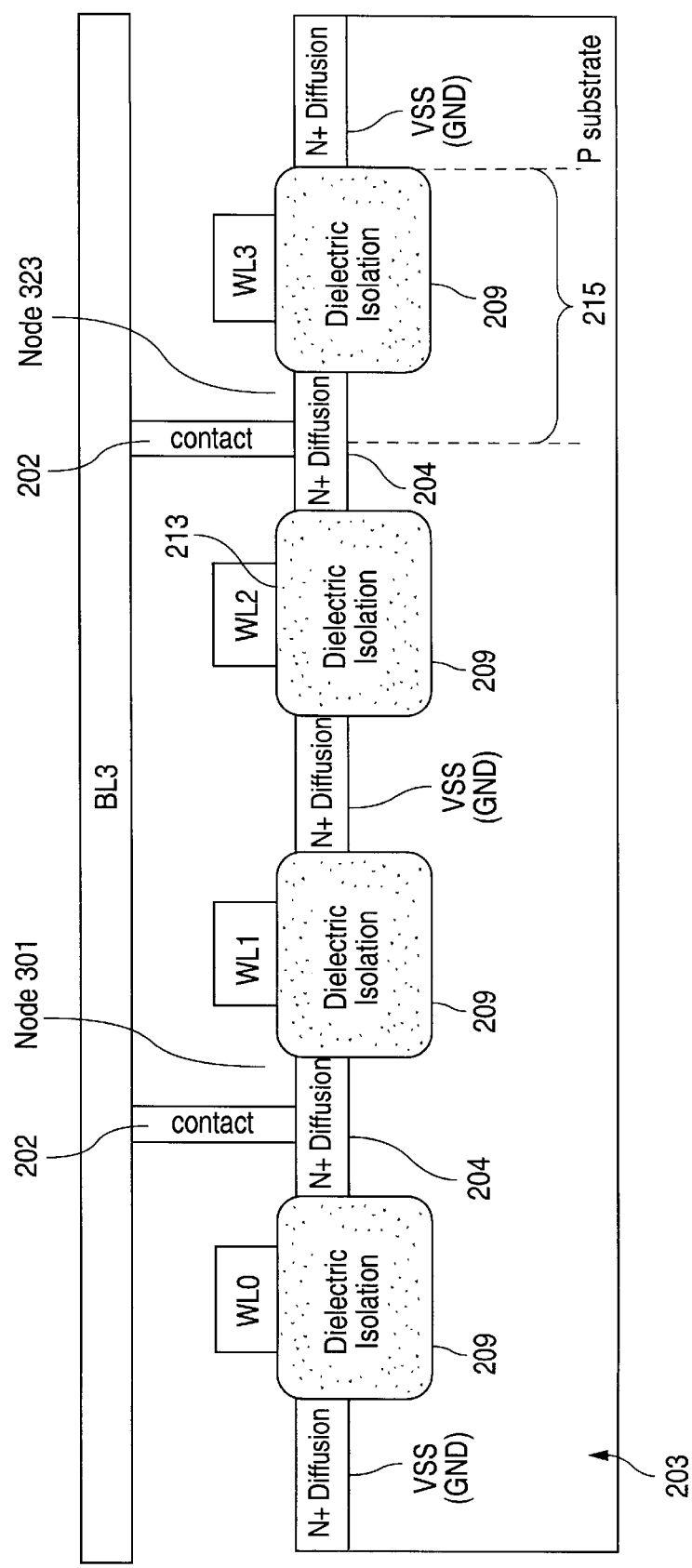
Figure 2E:
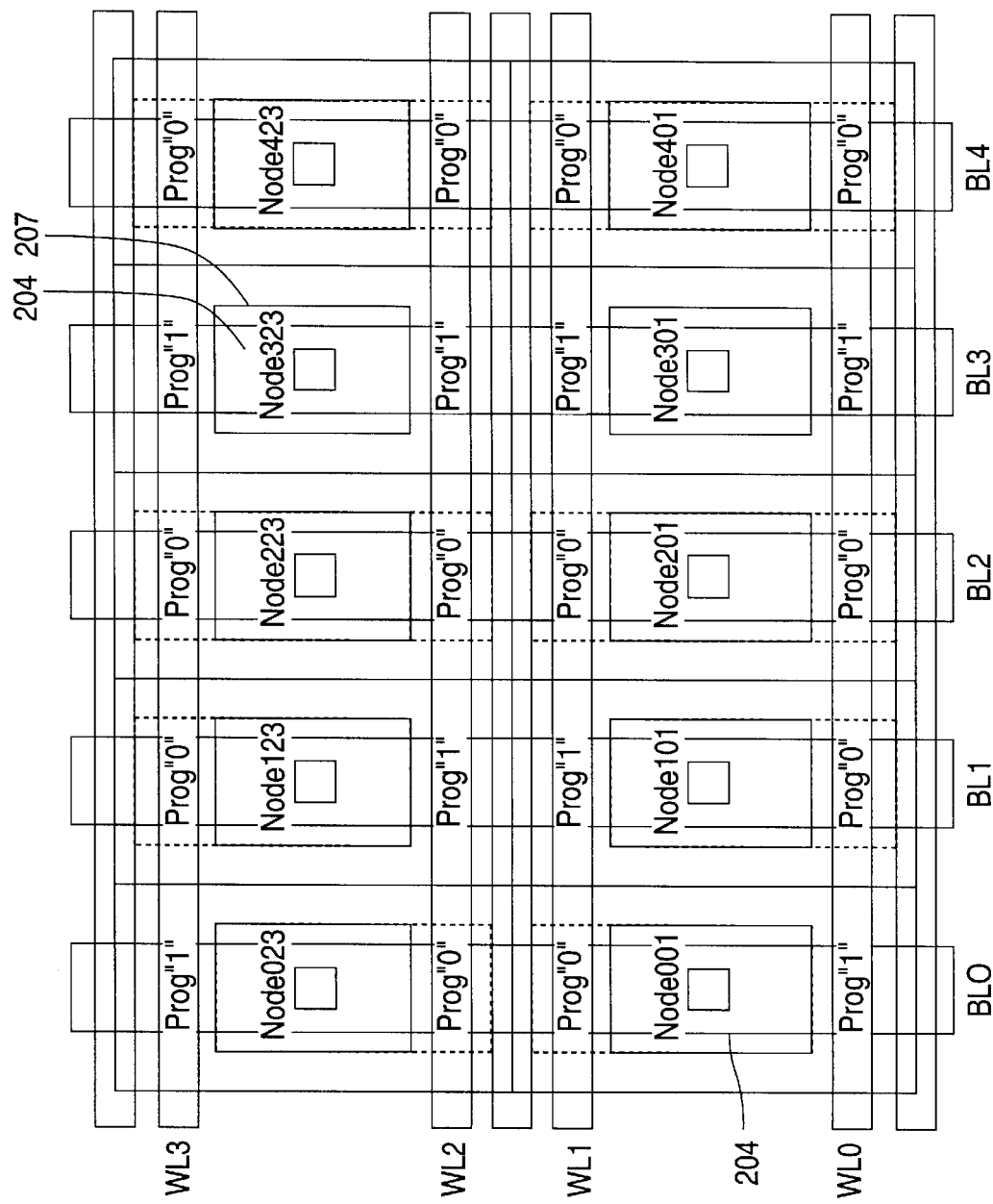
Figure 4C:
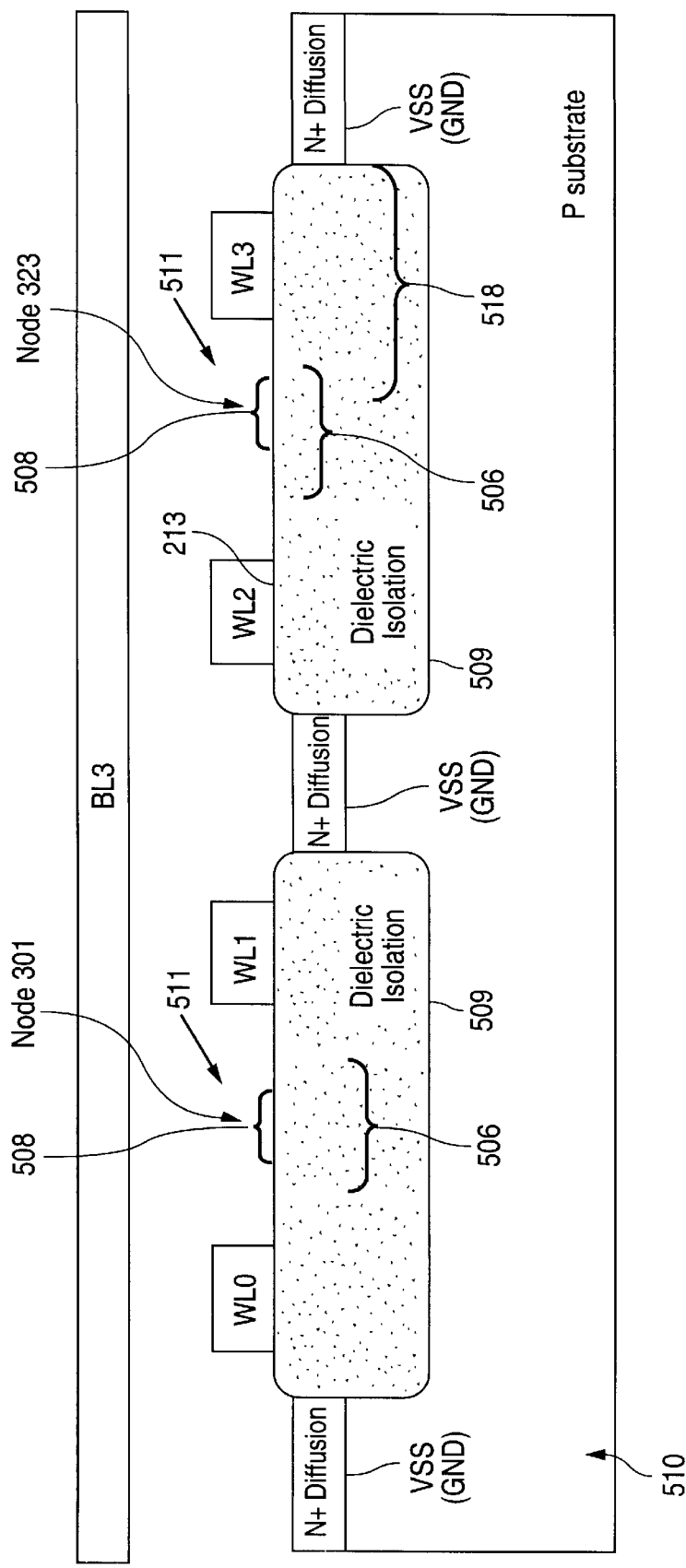

FIG. 4*c* shows a cross section Line B—B taken along bit line BL3 of FIG. 4*b*. As shown in FIG. 4*c*, node 323 corresponds to an intersection area between bit line BL3 and word lines WL2 and WL3. Bit cell regions are formed in the substrate in areas under the bit lines and the word lines. For example, the bit cell region 518 corresponds to the region where a transistor would be formed if BL3 and WL3 were coupled with a transistor. However, as shown in FIG. 4*c* there are no transistors coupling the bit line BL3 with the word lines WL0–WL3. In FIG. 4*c* in a region 506 there is no node diffusion region with N+ diffusion as is present in the prior art, which is shown in FIG. 2*d*. Also as shown in FIG. 4*c*, in a second region 508 there is no contact formed for coupling the bit line BL3 with a node diffusion region as is present in the prior art, which is shown in FIG. 2*d*. As shown in FIG. 4*c* the bit line BL3 is separated from the bit cell regions by an insulating layer 511 formed of a material such as silicon oxide or other suitable non-conductive material as is known in the art. As shown in FIG. 4c the region 506 and the areas adjacent to it are electrically isolated using a dielectric isolation region 509. As is known in the art the dielectric isolation regions 509 can be formed using shallow trench isolation techniques, or using LOCOS field oxidation techniques. Thus, the bit cell region 518 disposed in the substrate 510 from an area adjacent to where a contact would be formed if a contact were present at Node 323 to an area adjacent to the VSS (gnd area) substantially consists of the dielectric isolation region, whereas in a prior art ROM the bit cell region 215 (see FIG. 2d) includes both a node diffusion region 204 as well as a dielectric isolation region. When a voltage is applied to the corresponding word line no current will be detected on bit line BL3. Specifically, if a voltage is applied to WL3 no current will result on BL3, as there is no transistor connected between BL3 and WL3.

Figure 4D:
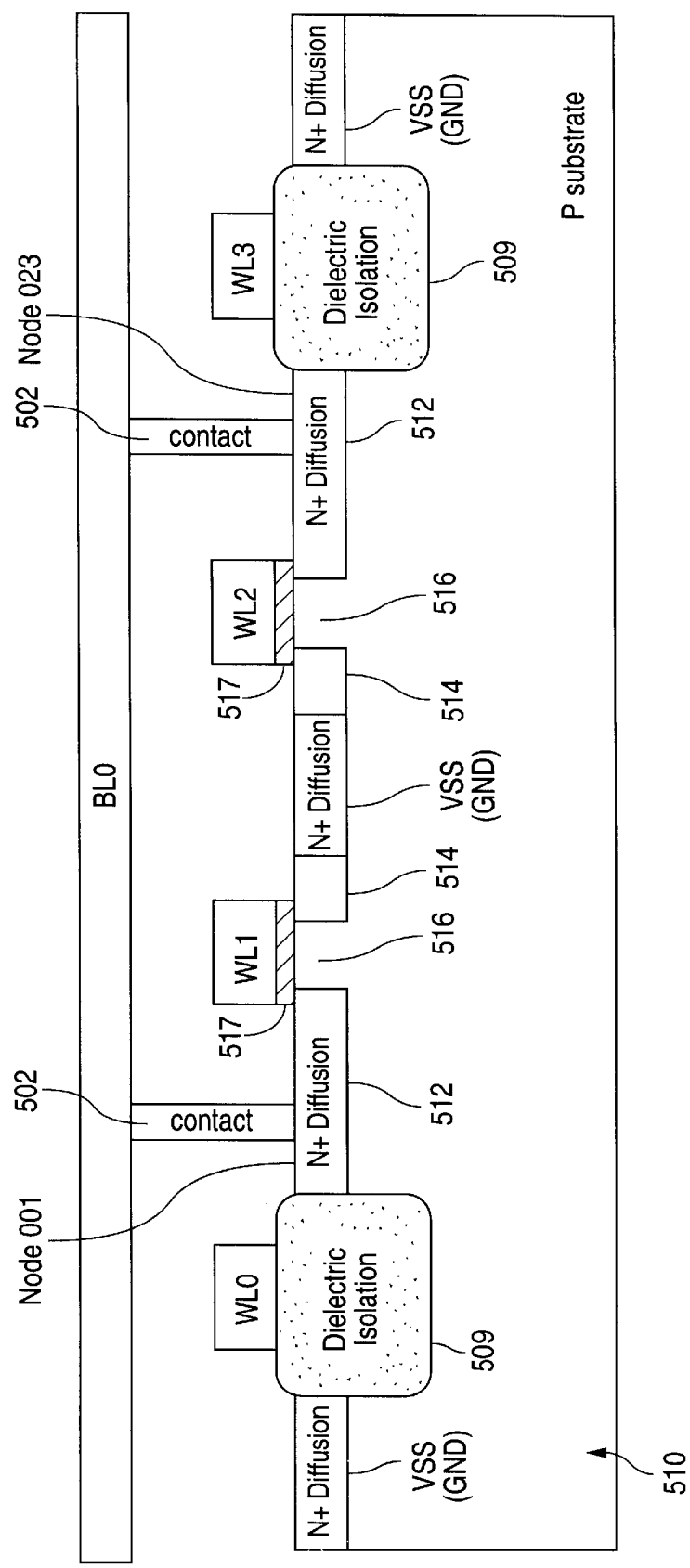

FIG. 4d shows a cross section Line A—A from FIG. 4b taken along bit line BL0. The diffusion regions 512 are regions where N+ diffusion is present. The regions 512 form drains for NMOS transistors. Note that unlike the drain areas of the prior art shown in FIG. 2c, which include the node diffusion areas 204 and then subsequently formed diffusion areas 210, the entire region 512 is formed during a single diffusion step. Simultaneously with the formation of the drain regions 512 the source regions 514 are also formed, with the source regions also including N type diffusion. The fact that the entire drain regions and source region are formed during a single process is reflected in FIG. 4b which shows the drain and source region as being continuous line 504 as opposed to the dotted line shown in FIG. 2b. The source regions 514 are coupled to the Vss (gnd) regions thereby coupling the resulting NMOS transistor to ground. Thus, the drain and source regions are formed to be N type conductivity, and disposed in a P type substrate 510, and form an NMOS transistor. In addition to the creation of the source 514 and 512 drain regions the contacts 502 are formed to couple the bit line BL0 with the drain regions 512. These contacts 502 are formed after N+ diffusion has formed the source 514 and drain 512 regions. When a voltage is applied to WL1, for example, the word line operates as a gate coupled to the channel region 516, via a dielectric layer 517, to cause the channel to allow for the flow of current between the source 514 and drain 512 of the transistor at node 001 which couples bit line BL0 to word line WL1.

Figure 5A:
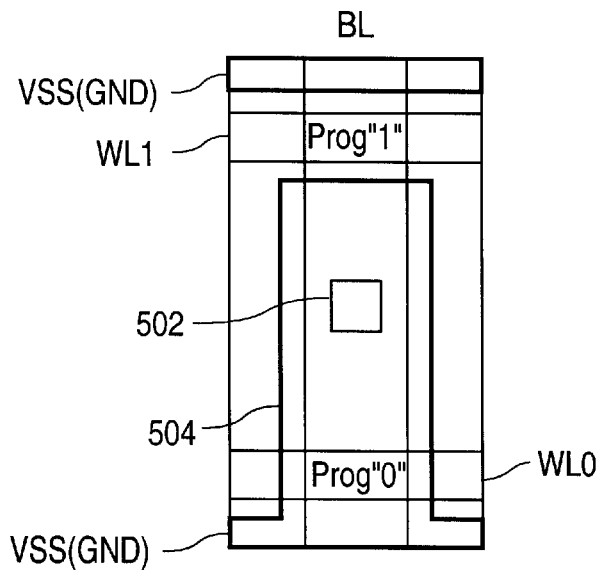
FIGS. 5*a–d* are views of bit cells of a ROM of the present invention.
Figure 5B:
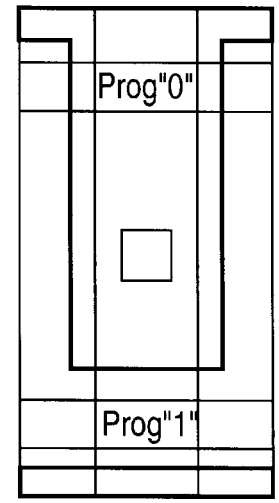
Figure 5C:
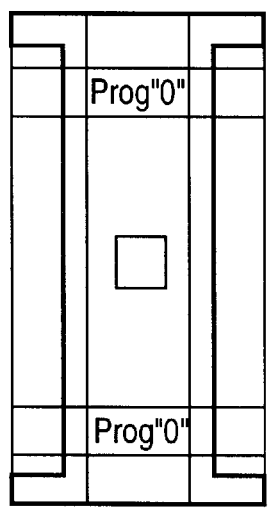
Figure 5D:
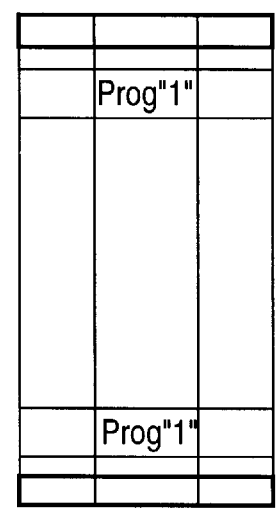

By forming the entire drain region during a single process the need to meet a minimum area rule as described above in connection with the prior art is not required. FIGS. 5a–d show the four possible programming states for a node. FIG. 5a shows a situation where an NMOS transistor is connected between the bit line BL and the word line WL0, and this transistor corresponds to a 0 being programmed between BL and WL0. The diffusion area is shown as 504 and the contact is shown as 502. FIG. 5b shows a transistor between the bit line BL and the word line WL1. FIG. 5c shows a situation where a one transistor is connected between BL and WL0, and a second transistor is connected between BL and WL1. FIG. 5d shows a node programmed such that there is no transistor between BL and WL0 (this cell is programmed 1) and there is no transistor between BL and WL1 (this cell is also programmed 1).

FIG. 3d illustrates a node which has been laid out with no constraint for minimum node diffusion area. For illustrative purposes FIG. 3d can be considered relative to the bit cells shown in FIGS. 3a–c. As shown in FIGS. 3a–c, the prior art nodes have a node diffusion area 204, and then in a subsequent diffusion step the N+ diffusion regions form the drain and the source. As shown in FIGS. 3a–c additional regions of N+ diffusion, for the drain and the source, are shown by the dotted lines. In contrast, for the bit cells of the present invention there is no node diffusion region where there is no transistor coupling the bit line to a word line. In the present invention, when the N+ diffusion is formed in a drain region 302 and a source region 304 this diffusion can be done during a single step, thus obviating the need for a minimum node diffusion region, and thereby allowing the overall size of the bit cells, nodes, and overall ROM array to be reduced.

By creating node diffusion regions and contacts only for those nodes where a transistor is to be connected between a bit line and a word line, current processes for fabricating a ROM array can yield an overall size reduction of greater than 15%. Further, by not creating node diffusion regions and contacts for those nodes where transistors are not connected between the bit line and the word line the overall capacitance of the ROM array is reduced. This lower capacitance is a result of the overall size reduction of the bit cells and the fact that a number of contacts in the ROM array is reduced. The lower capacitance and smaller size results in lower active power dissipation in the memory than is seen in prior art ROM arrays.

It should be recognized that a number of variations of the above described embodiments would be obvious to one of skill in the art. For example, one variation would be to use PMOS type transistors, where the diffusions regions would include P type diffusion and the substrate would be N type. Accordingly, although specific embodiments and methods of the present invention are shown and described herein, this invention is not to be limited by these specific embodiments. Rather, the scope of the invention is to be defined by the following claims and their equivalents.

What is claimed is:

1. A ROM for storing information, including:

a substrate having a plurality of bit cell regions formed in substrate;

a plurality of columns of bit lines proximate to the substrate;

a plurality of rows of word lines proximate to the substrate;

wherein intersection areas between the plurality of bit lines and the plurality of word lines form nodes which correspond to the plurality of bit cell regions formed in the substrate;

a first transistor formed in a first bit cell region, which corresponds a first node, wherein a first bit line at the first node is coupled to the first transistor by a first contact; and a second node wherein a second bit line at the second node is separated from a second bit cell region, which corresponds to the second node, by an insulating layer, such that the second bit line is electrically isolated from the second bit cell region.

2. The ROM of claim 1 wherein the second bit cell region consists substantially of an isolating dielectric material.

3. The ROM of claim 1 wherein the second node corresponds to the second bit cell region and to a third bit cell region, wherein the second bit cell region is disposed in the substrate in an area under a first word line and an area under the second bit line, and the third bit cell region is disposed in the substrate in an area under a second word line and an area under the second bit line, wherein the first and second bit cell regions substantially consist of an isolating dielectric material.

4. A ROM for storing information, including:
a substrate having a plurality of bit cell regions formed in substrate;
a plurality of columns of bit lines proximate to the substrate;
a plurality of rows of word lines proximate to the substrate;
wherein intersection areas between the plurality of bit lines and the plurality of word lines form nodes which correspond to the plurality of bit cell regions formed in the substrate;
a first transistor formed in a first bit cell region, which corresponds a first node, wherein a first bit line at the first node is coupled to the first transistor by a first contact;
a second node wherein a second bit line at the second node is separated from a second bit cell region, which corresponds to the second node, by an insulating layer;
wherein the second node corresponds to the second bit cell region and to a third bit cell region, wherein the second bit cell region is disposed in the substrate in an area under a first word line and an area under the second bit line, and the third bit cell region is disposed in the substrate in an area under a second word line and an area under the second bit line, wherein the first and second bit cell regions substantially consist of an isolating dielectric material; and
wherein the second bit cell region and the third bit cell region are disposed in the substrate between a first ground region in the substrate and a second ground region in the substrate.

5. The ROM of claim 1 wherein the first bit cell region includes a first drain region formed with a N+ diffusion region, and a first source region formed with a N+ diffusion region, wherein the first drain region and the first source region are formed simultaneously.

6. A ROM for storing information, including:
a substrate having a plurality of bit cell regions formed in substrate;
a plurality of columns of bit lines disposed proximate to the substrate;
a plurality of rows of word lines disposed proximate to the substrate;
wherein intersection areas between the plurality of bit lines and the plurality of the word lines form nodes which correspond to the plurality of bit cell regions formed in the substrate;
a first bit cell region, which corresponds to a first node, wherein a first transistor is formed in the first bit cell region, and wherein a first bit line at the first node is coupled to the first transistor by a first contact; and
a second bit cell region which corresponds to a second node, wherein the second bit cell region consists substantially of an isolating dielectric material.

7. The ROM of claim 6 wherein a second bit line at the second node is separated from the second bit cell region by an insulating layer.

8. The ROM of claim 6 wherein the second node corresponds to the second bit cell region and to a third bit cell region, wherein the second bit cell region is disposed in the substrate in an area under a first word line and an area under a second bit line, and the third bit cell region is disposed in the substrate in an area under a second word line and an area under the second bit line, wherein the second and third bit cell regions substantially consist of an isolating dielectric material.

9. A ROM for storing information, including:
a substrate having a plurality of bit cell regions formed in substrate;
a plurality of columns of bit lines disposed proximate to the substrate;
a plurality of rows of word lines disposed proximate to the substrate;
wherein intersection areas between the plurality of bit lines and the plurality of the word lines form nodes which correspond to the plurality of bit cell regions formed in the substrate;
a first bit cell region, which corresponds to a first node, wherein a first transistor is formed in the first bit cell region, and wherein a first bit line at the first node is coupled to the first transistor by a first contact;
a second bit cell region which corresponds to a second node, wherein the second bit cell region consists substantially of an isolating dielectric material;
wherein the second node corresponds to the second bit cell region and to a third bit cell region, wherein the second bit cell region is disposed in the substrate in an area under a first word line and an area under a second bit line, and the third bit cell region is disposed in the substrate in an area under a second word line and an area under the second bit line, wherein the second and third bit cell regions substantially consist of an isolating dielectric material; and
wherein the second bit cell region and the third bit cell region are disposed in a substrate between a first ground region in the substrate and a second ground region in the substrate.

10. The ROM of claim 6 wherein the first bit cell region includes a first drain region formed with an N+ diffusion area and a first source region formed with an N+ diffusion area wherein the source and drain regions are formed simultaneously.

11. A ROM comprising an array of bit cells, wherein the array of bit cells includes:
a first bit cell, storing a first type of information, wherein the first bit cell includes a first bit cell region disposed in a substrate, wherein the first bit cell region includes a first region which has a first conductivity type such that it forms a drain, and includes a second region of a second conductivity type of which is adjacent to the first region which forms a channel, and includes a third region which has the first conductivity type and forms a source; and
a second bit cell, storing a second type of information, wherein the second bit cell includes a second bit cell region disposed in a substrate, wherein the second type of bit cell region consists of a dielectric isolation region.

12. The ROM of claim 11, further including a first node which corresponds to the first bit cell, wherein the first node includes:

a first bit line disposed proximate to the first region;

a first word line disposed proximate to the second region; and a contact coupling the bit line to the first region, such that current can be detected on the first bit line when voltage is applied to the first word line.

13. The ROM of claim 12, further including a second node which corresponds to the second bit cell, wherein the second node includes:

a second bit line disposed proximate to the second bit cell region;

an insulating layer disposed between the second bit line and the second bit cell region; and a second word line disposed proximate to the second bit cell region.

14. The ROM of claim 11 wherein the first conductivity type is N type and the second conductivity type is P type.

15. The ROM of claim 11 wherein the drain and the source of the first type of bit cell are simultaneously formed N+ diffusion regions in a P type silicon substrate.

* * * * *